United States Patent
Komaki et al.

(10) Patent No.: US 10,418,544 B2
(45) Date of Patent: Sep. 17, 2019

(54) FACILITY AND METHOD FOR MANUFACTURING TORQUE SENSOR SHAFT

(71) Applicant: NAKAYAMA AMORPHOUS CO., LTD., Osaka (JP)

(72) Inventors: Masahiro Komaki, Osaka (JP); Hironobu Tsutano, Osaka (JP); Takumi Yoshida, Osaka (JP)

(73) Assignee: USUI CO., LTD., Shizuoka (JP)

( * ) Notice: Subject to any disclaimer, the term of this patent is extended or adjusted under 35 U.S.C. 154(b) by 11 days.

(21) Appl. No.: 15/575,041

(22) PCT Filed: Mar. 22, 2016

(86) PCT No.: PCT/JP2016/059045
§ 371 (c)(1),
(2) Date: Nov. 17, 2017

(87) PCT Pub. No.: WO2016/185785
PCT Pub. Date: Nov. 24, 2016

(65) Prior Publication Data
US 2018/0148820 A1     May 31, 2018

(30) Foreign Application Priority Data

May 21, 2015    (JP) ................................ 2015-103477

(51) Int. Cl.
*H01L 41/47*      (2013.01)
*B23Q 7/14*      (2006.01)
(Continued)

(52) U.S. Cl.
CPC ............ *H01L 41/47* (2013.01); *B23Q 7/1426* (2013.01); *B23Q 7/1463* (2013.01); *C23C 4/08* (2013.01);
(Continued)

(58) Field of Classification Search
CPC ....... H01L 41/04; H01L 41/12; H01L 41/125; H01L 41/47; H01L 41/08; H01L 41/0805;
(Continued)

(56) References Cited

U.S. PATENT DOCUMENTS 3,813,761 A * 6/1974 Foster ..................... H01L 21/00
                                                  438/134
3,817,209 A * 6/1974 Zurick .................... B41F 17/22
                                                  101/170
(Continued)

FOREIGN PATENT DOCUMENTS

CN           1248184       3/2000
DE         19519769 A1 * 12/1995 ............. G01L 3/102
(Continued)

OTHER PUBLICATIONS

English machine translation of WO 2012/173261, first published in Japanese Dec. 2012, 10 pages.*
(Continued)

*Primary Examiner* — Erica E Cadugan
*Assistant Examiner* — Michael Vitale
(74) *Attorney, Agent, or Firm* — Bacon & Thomas, PLLC

(57) ABSTRACT

The invention provides equipment for manufacturing a torque sensor shaft by forming a magnetostrictive region including a metallic glass coating in a predetermined pattern on a side face of a shaft-shaped workpiece. The shaft-shaped workpiece is rotatably attached on a conveying pallet. The conveying pallet is successively conveyed to each of work devices including a preheating device for the shaft-shaped workpiece, a thermal spraying device for forming a metallic glass coating on a side face of the shaft-shaped workpiece, a masking device configured to provide a covering corresponding to the pattern on the coating, and a shot blasting device configured to provide shot blasting directed toward
(Continued)

the metallic glass coating including the covering. Preheating, thermal spraying, masking, and shot blasting are performed respectively on the shaft-shaped workpiece while rotating the shaft-shaped workpiece on the conveying pallet at each of the work devices. Therefore, the favorable manufacturing equipment can be provided.

10 Claims, 14 Drawing Sheets

(51) Int. Cl.
    *H01L 41/12*     (2006.01)
    *C23C 4/129*     (2016.01)
    *C23C 4/08*     (2016.01)
    *G01L 3/10*     (2006.01)

(52) U.S. Cl.
    CPC ............. *C23C 4/129* (2016.01); *G01L 3/102* (2013.01); *H01L 41/12* (2013.01); *B65D 2519/00004* (2013.01); *B65D 2519/00293* (2013.01); *Y10T 29/42* (2015.01); *Y10T 29/49075* (2015.01); *Y10T 29/5124* (2015.01); *Y10T 29/5128* (2015.01); *Y10T 29/5196* (2015.01)

(58) Field of Classification Search
    CPC . H01L 41/081; H01L 41/0815; H01L 41/082; H01L 41/0825; G01L 3/102; B65D 2519/00; B65D 2519/00004; B65D 2519/00258; B65D 2519/00293; B23Q 7/1426–1494; Y10T 29/42; Y10T 29/49032; Y10T 29/49075; Y10T 29/5124; Y10T 29/5196; Y10T 29/5128; Y10T 29/5129
    USPC ..... 29/25.35, 33 P, 38 A, 38 B, 563, 603.07, 29/607; 198/345.3, 346.1
    See application file for complete search history.

(56) References Cited

U.S. PATENT DOCUMENTS

| | | | | |
|---|---|---|---|---|
| 5,142,919 A | * | 9/1992 | Satoh | G01L 3/102 73/862.333 |
| 5,193,267 A | * | 3/1993 | Satoh | G01L 3/102 29/602.1 |
| 5,449,418 A | * | 9/1995 | Takagi | G01B 7/24 148/304 |
| 5,589,645 A | * | 12/1996 | Kobayashi | G01L 3/102 324/209 |
| 6,004,627 A | | 12/1999 | Duffy et al. | |
| 8,181,538 B2 | * | 5/2012 | Yamamura | B62D 6/10 29/595 |
| 8,302,492 B2 | * | 11/2012 | Shimizu | B62D 5/04 73/862.333 |
| 2002/0078765 A1 | * | 6/2002 | Shinoura | G01L 3/102 73/862.333 |
| 2007/0089287 A1 | * | 4/2007 | Harata | G01L 3/102 29/602.1 |
| 2007/0204703 A1 | * | 9/2007 | Cripe | G01L 3/103 73/862.08 |
| 2010/0266780 A1 | * | 10/2010 | Lawrynowicz | B05B 12/12 427/446 |
| 2011/0167929 A1 | * | 7/2011 | Ling | C23C 4/06 73/862.333 |

FOREIGN PATENT DOCUMENTS

| | | | | |
|---|---|---|---|---|
| EP | 1477788 A2 | * | 11/2004 | ............. G01L 3/102 |
| JP | 07316658 A | * | 12/1995 | ............. G01L 3/102 |
| JP | 2974871 B2 | | 11/1999 | |
| JP | 2001-041833 A | | 2/2001 | |
| JP | 2002250662 A | * | 9/2002 | ............. G01L 3/102 |
| JP | 2003-305619 A | | 10/2003 | |
| JP | 2007-285793 A | | 11/2007 | |
| WO | WO-2011086669 A1 | * | 7/2011 | ............. B05B 7/205 |
| WO | 2012/173261 A1 | | 12/2012 | |

OTHER PUBLICATIONS

English machine translation of Japan 2003-305619, first published in Japanese Oct. 2013, 15 pages.*

Extended European Search Report in corresponding European Application No. 16796179.6, dated Dec. 19, 2018.

International Search Report of International Application No. PCT/JP2016/059045, dated May 10, 2016.

Zhu, et al., "Development and Application of Vehicle Axle Washing Machine of Metallurgical Transportation Vehicle" (2011).

* cited by examiner

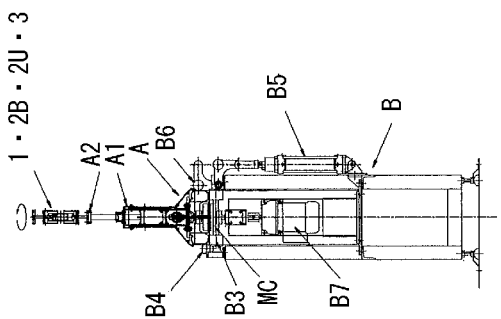
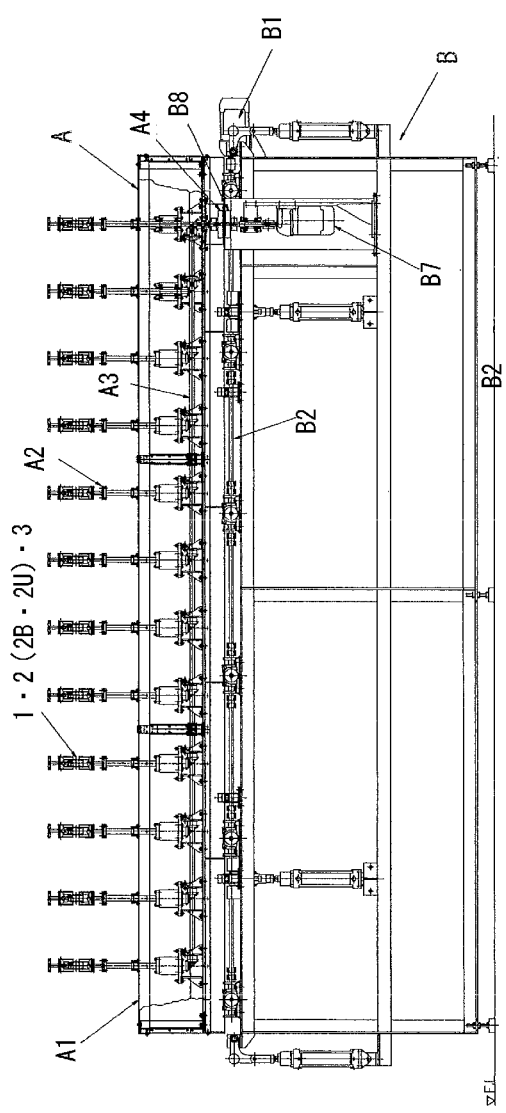
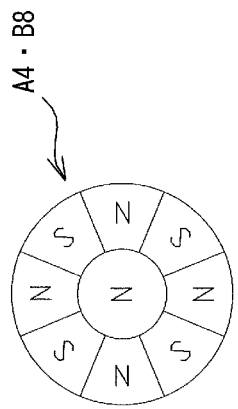

FACILITY AND METHOD FOR MANUFACTURING TORQUE SENSOR SHAFT

TECHNICAL FIELD

The present invention relates to equipment for manufacturing a torque sensor shaft having a magnetostrictive region for torque detection on the surface of the shaft (rotary shaft), and to a method for manufacturing the same.

BACKGROUND ART

The general structure of a torque sensor configured to detect torque using a shaft having a magnetostrictive region is shown in FIG. 14. A shaft 1 that is subjected to torque is supported in a housing 7, by way of a bearing 6, and magnetostrictive regions V/W are formed around the entire circumference) (360° of a portion of the surface of the shaft 1. Furthermore, coils X/Y are disposed at positions near the respective outer circumferences of the magnetostrictive regions V/W, within the housing 7. Generally, for the magnetostrictive regions V/W, magnetic material is formed on the side face of the shaft 1, in helical striped patterns inclined in mutually opposite directions with respect to the axial direction (which is to say, in chevrons), as shown in the figures (in other words, the coatings or protrusions of the magnetic substance are formed as multiple helical lines). As shown in the figure, the housing 7 is also provided with an amplifier board 8, a signal line connector 9 and the like.

When a torque acts on the shaft 1, tensile stress and compressive stress are generated in the respective magnetostrictive regions V/W and, consequently, the magnetic permeability of the magnetostrictive regions V/W respectively increases or decreases due to mutually opposite magnetostrictive effects. Induced electromotive forces are generated in the coils X and Y based on the change in the magnetic permeability, and therefore a voltage output that is proportional to the magnitude of the torque can be obtained by performing DC conversion and differentially amplifying the two.

Patent Literature 1, below, discloses a shaft having excellent torque detection characteristics, which can be used for a torque sensor of the type described above. That is to say, the surface of the shaft is provided with a magnetostrictive region including a coating of metallic glass (amorphous alloy), the coating being formed on the surface of the shaft by thermal spraying, with a method in which the flame is rapidly cooled. Thermal spraying in which the flame is rapidly cooled refers to a thermal spraying method in which a flame including a metal powder is sprayed, melting the metal powder, and the flame is cooled from the outside by a cooling gas, before it reaches the shaft surface.

When the shaft described in Patent Literature 1 is used for torque sensor shafts, the torque detection characteristics are improved for the following reasons. That is to say:

a) because the amorphous alloy has high magnetic permeability and high magnetostriction, a torque sensor using the shaft having the metallic glass in the magnetostrictive region will have high torque detection sensitivity;

b) since the metallic glass coating is formed on the surface of the shaft by thermal spraying, the adhesion between this coating and the shaft will be high, so that the hysteresis will be lower than in cases where this coating is fixed with an adhesive or the like; and c) if this coating is formed by thermal spraying, because the coating is laminated onto, and adhered with, the shaft simultaneously with amorphization, the magnetostrictive region will be formed easily and quickly. If a method is adopted in which a flame including a metal powder is sprayed so as to first melt the metal powder and so as to be rapidly cooled, the adhesion of the metallic glass coating to the shaft surface will be particularly high, which is advantageous in view of b), above.

CITATION LIST

Patent Literature

[PTL 1] Re-Publication of PCT International Publication No. WO 2012/173261

SUMMARY OF INVENTION

Technical Problem

In order to form a metallic glass coating on the surface of the shaft with the rapid cooling type thermal spraying described above, it is necessary to suitably preheat the shaft and also control the thermal spraying temperature. Various processing is also required to produce a magnetostrictive region with a pattern suitable for torque detection from the coating that has been formed. If the thermal spraying, or any of the processing therebefore or thereafter, is not suitable, the metallic glass layer will not be formed, or the adhesion of the coating to the shaft will be insufficient, such that it will not be possible to ensure the torque detection characteristics.

Consequently, in order to mass-produce torque sensor shafts, it is necessary to employ equipment and methods allowing thermal spraying and the processing therebefore and thereafter to be performed suitably and smoothly.

In view of the objects described above, the present invention is directed to providing manufacturing equipment and a manufacturing method which are favorable for torque sensor shafts.

Solution to Problem

The manufacturing equipment of the invention is equipment for manufacturing torque sensor shafts by forming a magnetostrictive region including a metallic glass coating in a predetermined pattern on a side face of shaft-shaped workpieces (which are hollow or solid), wherein:

the shaft-shaped workpieces are rotatably attached on a conveying pallet;

the conveying pallet is successively conveyed to work devices including a preheating device for the shaft-shaped workpiece, a thermal spraying device configured to form a metallic glass coating on a side face of the shaft-shaped workpiece, a masking device configured to provide a covering corresponding to the pattern on the coating, and a shot blasting device configured to provide shot blasting directed toward the metallic glass coating including the covering; and preheating, thermal spraying, masking, and shot blasting are each performed on the shaft-shaped workpieces while rotating the shaft-shaped workpieces on the conveying pallet at each work device.

FIG. 1 shows an example of equipment having such a configuration.

With such equipment, torque sensor shafts can be efficiently manufactured by forming a magnetostrictive region having a predetermined pattern including a metallic glass coating on the side face of each shaft-shaped workpiece. The reason of this is that preheating, thermal spraying, masking and shot blasting are each performed on each shaft-shaped workpiece by successively conveying the conveying pallet, on which the shaft-shaped workpieces are attached, to the locations of each of the work devices, and because the shaft-shaped workpieces on the conveying pallet are rotated, each of the processes of preheating, thermal spraying, masking and shot blasting can be performed around the entire circumferential region of a portion of the side faces of the workpieces.

Note that the aforementioned masking is a process for forming a resin coating (for example, a rubber coating) on the metallic glass coating on the shaft-shaped workpiece, which has the same pattern as the helical striped pattern for the magnetostrictive region. With such a resin coating as the covering, only the metallic glass coating in the parts without the covering will be removed as a result of performing shot blasting directed to the metallic glass coating having the covering, and thus the magnetostrictive region having the striped pattern can be produced from the metallic glass coating.

In the manufacturing equipment described above, it is preferable that:
  each of the shaft-shaped workpieces is hollow (which is to say tubular) and has a magnetostrictive region formation part in the vicinity of the longitudinal center thereof,
  the entire length (the entirety) of the workpiece on the conveying pallet covers the outside of a rod-like holder on the conveying pallet so as to be rotatably supported, and the workpiece is covered, at both ends respectively, by symmetrical (including substantially symmetrical) shaped cylindrical covers, so as to expose the formation part; and
  each of the cylindrical covers has an opening that exposes part of the workpiece.

Examples thereof are shown in FIGS. 2A to 2C and FIGS. 3A to 3E. In FIGS. 3A to 3E, reference numeral 1 denotes a shaft-shaped workpiece, and reference numerals 2B and 3 denote a rod-like holder and a cylindrical cover. An opening 3b in the cylindrical cover 3 shown in FIG. 3B is the aforementioned opening that exposes part of the shaft-shaped workpiece 1.

Proceeding as described above, as shown in FIG. 3E, each hollow shaft-shaped workpiece 1 covers a rod-like holder 2B so as to be rotatably supported on a conveying pallet A, and both ends thereof are covered by cylindrical covers 3 in a manner such that a magnetostrictive region formation part 1a in the vicinity of the center is exposed. Since the cylindrical covers 3 expose the magnetostrictive region formation part 1a but cover the other portions, it is possible to perform preheating, thermal spraying, masking and shot blasting with each of the work devices mentioned above, only on the exposed magnetostrictive region formation part 1a, allowing the magnetostrictive region to be formed smoothly.

For reasons such as the fact that cylindrical covers having symmetrical shapes (the shapes being symmetrical and the dimensions, materials and the like being the same) are used at both ends of the shaft-shaped workpieces as the aforementioned cylindrical covers, it is possible to prevent uneven temperatures in the magnetostrictive region formation part at the center of the shaft-shaped workpiece when the portion undergoes preheating and thermal spraying. The reason for this is that uneven heat capacity toward either of the ends of the shaft-shaped workpiece that has been united with the holder can be avoided, because the cylindrical covers symmetrically cover both sides of the magnetostrictive region formation part and the entire length of the shaft-shaped workpiece covers the outside of the rod-like holder.

Furthermore, because each of the cylindrical covers has an opening as described above, preheating can be suitably performed on the shaft-shaped workpiece. Supposing that there was no such opening, when the exposed magnetostrictive region formation part and the periphery thereof were preheated with a burner or the like, it would difficult to heat portions other than the magnetostrictive region formation part, and thus lower temperature regions would tend to be produced at locations within the portion which are closer to the ends. As a result of heating the outer sides of the magnetostrictive region formation part with the openings in each of the cylindrical covers provided as described above, it is possible to uniformly preheat the entirety of the portion, which has heretofore not been possible.

As described above, by using the holders and cylindrical covers, as described above, for the aforementioned hollow shaft-shaped workpiece, it is possible to suitably preheat the magnetostrictive region formation part, allowing a favorable thermal spraying coating to be formed.

Alternatively, in the manufacturing equipment described above, it is also preferable that
  each of the shaft-shaped workpieces is solid (which is to say, a rod that is not hollow) and has a magnetostrictive region formation part in the vicinity of the longitudinal center thereof,
  a first end of the workpiece on the conveying pallet is inserted inside a sleeve-like holder on the conveying pallet so as to be rotatably supported, and is covered by a cylindrical cover while, at a second end of the workpiece, a sleeve-like holder shaped symmetrical (including substantially symmetrical) to the aforementioned holder is also attached and the workpiece is covered by a cylindrical cover shaped symmetrical (including substantially symmetrical) to the aforementioned cylindrical cover, so as to expose the formation part; and
  each of the holders and each of the cylindrical covers have an opening that exposes part of the workpiece.

Examples thereof are shown in FIGS. 2A to 2C and FIGS. 4A to 4D. In the figures, reference numeral 1 denotes a shaft-shaped workpiece, and reference numerals 2 and 3 denote a holder and a cylindrical cover. Openings 2c and 3b in the holder 2 and the cylindrical cover 3 shown in FIG. 4C and FIG. 4B are the aforementioned openings, which expose part of the shaft-shaped workpiece 1.

In this manner, as shown in FIG. 4D, a first end (the bottom end in the illustrated example) of each shaft-shaped workpiece 1 is rotatably supported on the conveying pallet A by a holder 2 and covered by the cylindrical cover 3, in a manner such that the magnetostrictive region formation part 1a is exposed. Furthermore, a holder 2 similar to the holder 2 at the first end is attached to a second end (the top end in the illustrated example) of each shaft-shaped workpiece 1, and covered by a cylindrical cover 3 similar to the cylindrical cover 3 at the first end, in a manner such that the formation part 1a is exposed. Since the cylindrical covers 3 at the first end and the second end expose the magnetostrictive region formation part 1a in the center of the shaft-shaped workpiece 1 but cover the other portions, it is possible to perform preheating, thermal spraying, masking and shot blasting with each of the work devices described above, only on the exposed magnetostrictive region formation part 1a, allowing the magnetostrictive region to be formed smoothly.

Because symmetrical shapes are used for each of the aforementioned holders and cylindrical covers (holders and cylindrical covers having shapes that are symmetrical, and which are of the same dimensions, materials and the like) at the first end and the second end of the shaft-shaped workpiece, it is easy to prevent uneven temperatures in the magnetostrictive region formation parts at the center of the shaft-shaped workpiece when the portions undergo preheating and thermal spraying. On the basis of the cylindrical covers symmetrically and equally covering both sides of the magnetostrictive region formation part, and there being substantially no difference in the heat capacity in the shaft-shaped workpiece which is mounted in the holders so as to be united with the holders on both sides of the magnetostrictive region formation part, it is possible to prevent uneven temperatures toward either end of the portion.

Furthermore, because each of the holders and each of the cylindrical covers have an opening as described above, preheating can be suitably performed on the shaft-shaped workpiece easily. This is because the outside portions of the magnetostrictive region formation part are also heated through the openings in each holder and each cylindrical cover, whereby the entirety of the formation part can be uniformly preheated in the same manner as in the case described above.

As described above, by using the holders and the cylindrical covers, as described above, for the aforementioned solid shaft-shaped workpiece, it is possible to suitably preheat the magnetostrictive region formation part, allowing a favorable thermal spraying coating to be formed.

In the manufacturing equipment described above, it is preferable that:
  each of the work devices is provided with a conveying device that conveys the conveying pallet along a fixed path and stops the conveying pallet at a fixed position;
  the conveying device is provided with a motor for rotating the shaft-shaped workpieces on the conveying pallet that has been stopped at a fixed position and a drive-side magnetic coupling for transmitting the driving force of the motor to the conveying pallet; and
  the conveying pallet is provided with a driven-side magnetic coupling that receives the driving force in a contactless manner from the drive-side magnetic coupling when the conveying pallet has been stopped at a fixed position, and a transmission mechanism for transmitting the driving force to each of the shaft-shaped workpieces.

FIGS. 2A to 2C shows an example of manufacturing equipment having such a conveying pallet A and a conveying device B.

With equipment such as described above, the conveying pallet is conveyed between the work devices by the conveying devices, and when the conveying pallet is stopped at a fixed position that is appropriate for work at each of the work devices, the conveying pallet receives the driving force of a motor in the conveying device, and thus can rotate the shaft-shaped workpieces that it holds. At that time, the driving force of the motor in the conveying device is transmitted to the shaft-shaped workpieces via a magnetic couple between a drive-side magnetic coupling provided on the conveying device and a driven-side magnetic coupling provided in the conveying pallet, and by a transmission mechanism on the conveying pallet.

If such a configuration is adopted, it will not be necessary to mount a drive source (such as a motor) on the conveying pallet in order to rotate the shaft-shaped workpieces. This allows the conveying pallet to be configured so as to be lightweight and simple, at low costs.

Furthermore, because the magnetic couplings allow contactless power transmission, there will be no need for a means for mechanically engaging a power transmission device between the conveying pallet and the conveying device. That is to say, it will be possible to simply stop the conveying pallet at the fixed position to transmit power from the conveying device to the conveying pallet without engaging a coupling joint or the like. This is also advantageous in terms of allowing the configuration of the equipment to be simplified.

In the manufacturing equipment described above, it is also further preferable that:
  a plurality of shaft-shaped workpieces are attached on the conveying pallet;
  the number of one or more of burners in the preheating device, thermal spray guns in the thermal spraying device, covering material application rollers in the masking device, or blast guns in the shot blasting device is less than the number of shaft-shaped workpieces provided on the conveying pallet, and the one or more thereof can be moved in a direction in which the shaft-shaped workpieces are arrayed on the conveying pallet.

Likewise, in the thermal spraying device 40 illustrated in FIG. 10, while there are twelve shaft-shaped workpieces on the conveying pallet A, there are only four thermal spray guns 47, and the thermal spray guns 47 can be moved to the left and the right by a servo motor 44 in the thermal spraying device 40.

With consideration for efficiency, in equipment in which a plurality of shaft-shaped workpieces are attached to a conveying pallet, burners, thermal spray guns, coating material application rollers, and blast guns having the same number as the shaft-shaped workpieces will ideally be provided in each of the aforementioned work devices. This is because the work can be simultaneously performed by each of the work devices on all of the shaft-shaped workpieces on the conveying pallet, allowing the torque sensor shafts to be manufactured efficiently.

However, the manufacturing equipment described above, in which the number of one or more of burners, thermal spray guns, covering material application rollers or blast guns is less than the number of shaft-shaped workpieces, is advantageous in terms of equipment costs. That is to say, such equipment does not have as high a level of manufacturing capacity as the aforementioned equipment having the same number of instruments, such as burners, as shaft-shaped workpieces, but the equipment costs are reduced to an extent commensurate with the reduced number of instruments such as burners. It is possible to perform the necessary work on all of the shaft-shaped workpieces by moving the instruments that are provided in smaller numbers in the direction in which the shaft-shaped workpieces are arrayed.

Moreover, in cases where each of the work devices is respectively supplied with one conveying pallet at the same time and the operations are performed at the same time, it is possible to minimize the efficiency loss that would result by provision in smaller numbers, by suitably establishing the numbers of instruments such as burners to suit the time required for the processes in each of the work devices. That is to say, it is possible to avoid greatly delaying the overall process by providing a small number of instruments for the work in the work devices that perform processes requiring a short period of time, and moving these instruments so as to perform the work on a plurality of shaft-shaped workpieces while other work devices perform processes requiring a long period of time.

In the manufacturing equipment described above, alternatively it is also preferable that:

one or more of a burner in the preheating device, a thermal spray gun in the thermal spraying device, a covering material application-like roller in the masking device, or a blast gun in the shot blasting device is supported by a support means at a position higher than the shaft-shaped workpieces on the conveying pallet.

FIG. 6, FIG. 7, and FIG. 8 respectively illustrate a preheating device, a thermal spraying device and a shot blasting device, in which the burner, the blast gun and the thermal spray gun are supported by a support means (a support frame or the like) at a position higher than the shaft-shaped workpiece on the conveying pallet.

If the burner, the thermal spray gun, the covering material application roller, or the blast gun is supported at a high position by such a support means, a space for workers can easily be reserved at the floor of the equipment (a space for workers to perform work associated with manufacturing, as well as inspection, maintenance and the like).

In the manufacturing equipment described above, it is further suitable that:

a traversing device that can cause the conveying pallet to traverse in a direction perpendicular to the conveying path of the conveying devices is provided in addition to the conveying devices, and the conveying pallet is conveyed along a circulating path by both types of devices, whereby the conveying pallet is successively conveyed between each of the work devices.

In each of the manufacturing equipment in FIG. 1 and FIG. 13, two traversing devices C (C1 and C2) are arranged, and together with the conveying devices B, these configure a circulating path for the conveying pallet A.

If no traversing device were installed, in many cases, the conveying path for the conveying pallet would have to be configured linearly (a one-way or reciprocating path). However, when a traversing device is additionally installed as described above, the conveying pallet can be conveyed along a circulating path rather than a linear path. Thus, the equipment can be made more compact by shortening the total length of the equipment.

In the manufacturing equipment described above, it is particularly preferable that:

the thermal spraying device performs thermal spraying of a type in which a flame including a metal powder is sprayed from a thermal spray gun, melting the metal powder, and the flame is cooled by cooling gas from the outside before reaching the surface of the shaft-shaped workpiece; and the temperature of the surface of the shaft-shaped workpiece that is subjected to thermal spraying is measured by a non-contact type thermometer, and the temperature of the shaft-shaped workpiece during thermal spraying is kept constant by shifting the position of the thermal spray gun depending on the measured value of the temperature.

Likewise in the thermal spraying device 40 illustrated in FIG. 10, a thermal spray gun 47 configured to perform thermal spraying as described above and a non-contact type thermometer 48 configured to measure the temperature of the surface of the shaft-shaped workpiece are provided, so as to control the temperature of the shaft-shaped workpiece 1 during thermal spraying by way of the procedure described above.

With equipment for manufacturing a torque sensor having such a thermal spraying device, since the surface of the shaft-shaped workpiece can be maintained in a favorable temperature range during the thermal spraying, metallic glass coating can be suitably formed on the surface of the shaft-shaped workpiece.

In the manufacturing equipment described above, it is further preferable that:

a cleaning device configured to remove the covering after performing shot blasting is provided, having a structure in which a wire brush roller is pressed against the side face of the shaft-shaped workpiece by a fluid pressure cylinder, and including a spring for setting the pressing pressure, between the working part of the fluid pressure cylinder and a wire brush roller.

FIG. 12 shows one example of such a cleaning device. In the figure, reference numeral 89 is a wire brush roller, and reference numeral 87 is a spring for setting the pressing pressure.

If the torque sensor manufacturing equipment has such a cleaning device, this equipment can automatically perform work to remove the blasted covering and clean the surface of the shaft after the shot blasting. Consequently, the workload on workers associated with manufacturing the torque sensor shaft will be further reduced.

Note that the pressing pressure of the wire brush roller that presses against the side face of the shaft-shaped workpiece can be suitably set by way of the selection of the aforementioned spring. Accordingly, it is possible to prevent the pressing pressure from being too great or too low.

A method for manufacturing a torque sensor according to the invention:

is a method for manufacturing a torque sensor shaft by forming a magnetostrictive region including a metallic glass coating in a predetermined pattern on a side face of a shaft-shaped workpiece; and includes using the manufacturing equipment described in any of the foregoing to perform preheating, thermal spraying, masking, and shot blasting on the shaft-shaped workpiece while rotating the shaft-shaped workpiece on the conveying pallet at each of the work devices.

With this method, the torque sensor shaft can be manufactured smoothly, using the equipment set forth above.

Advantageous Effects of Invention

With the manufacturing equipment and manufacturing method of the invention, it is possible to suitably perform thermal spraying necessary for manufacturing a torque sensor shaft and the processes therebefore and thereafter in accordance with predetermined procedures and conditions. It is thereby possible to smoothly mass-produce high-quality torque sensor shafts.

BRIEF DESCRIPTION OF DRAWINGS

FIGS. 2A to 2C show conveying pallet A and a conveying device B for a shaft-shaped workpiece 1, in which FIG. 2A is a front view, FIG. 2B is a side view, and FIG. 2C is a view showing the arrangement of the magnetic poles of the magnetic couplings provided on the conveying pallet A and the conveying device B.

FIG. 3A shows a hollow shaft-shaped workpiece 1, FIG. 3B shows a cylindrical cover 3, FIG. 3C shows a holder 2B, FIG. 3D shows an upper holder 2U, and FIG. 3E shows the manner in which these are attached.

FIG. 4A shows a solid shaft-shaped workpiece 1, FIG. 4B shows a cylindrical cover 3, FIG. 4C shows a holder 2, and FIG. 4D shows the manner in which these are attached.

FIG. 1 shows equipment for manufacturing a torque sensor shaft in one embodiment of the invention. This equipment is such that work devices, such as a mounting/dismounting device 10, a preheating device 20, a shot blasting device 30, a thermal spraying device 40, a masking device 60, a shot blasting device 70, and a cleaning device 80, described hereafter, are arranged as shown in the figure. Hollow or solid shaft-shaped workpieces 1 (see FIGS. 3A to 3E and FIGS. 4A to 4D) for producing torque sensor shafts are successively conveyed to each of the work devices, and each shaft-shaped workpiece 1 is subjected to processing by each of the work devices. Thus, a magnetostrictive region including a metallic glass coating is formed on each of the shaft-shaped workpieces 1 so as to manufacture a shaft having excellent torque detection characteristics.

Figure 1:
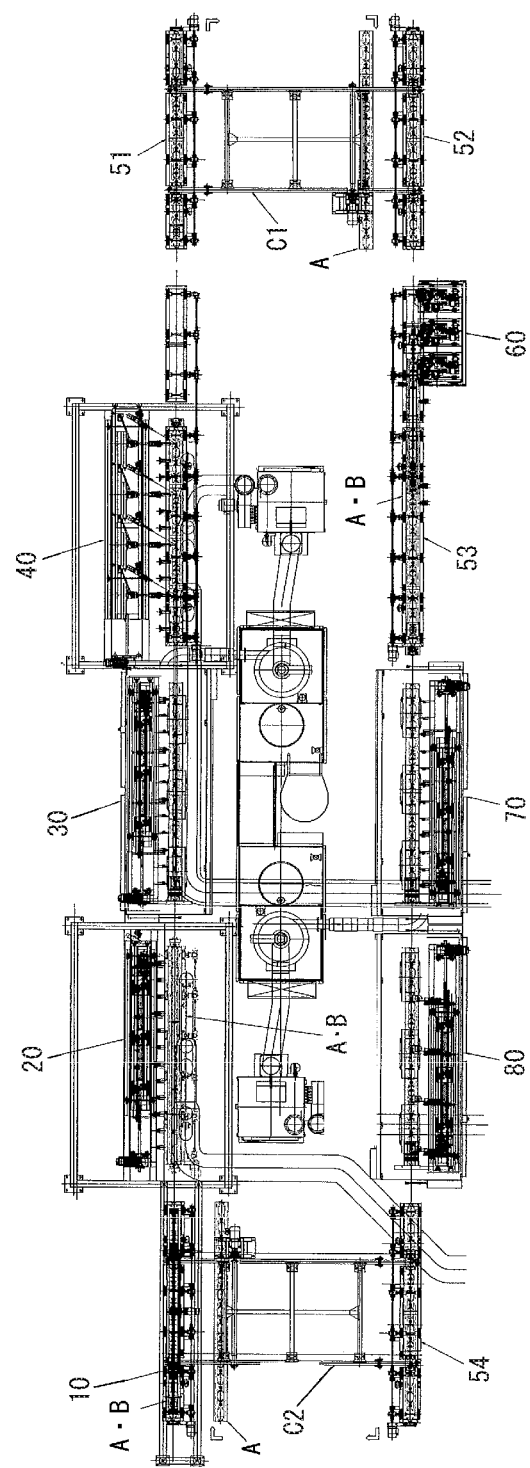
FIG. 1 is a plan view showing the overall arrangement of equipment for manufacturing a shaft according to an embodiment.

In the manufacturing equipment in FIG. 1, the shaft-shaped workpiece 1 is conveyed using the conveying pallet A and the conveying device B shown in FIG. 2A and FIG. 2B. The conveying pallet A is such that support members A2 for the shaft-shaped workpieces 1 are rotatably provided in a frame A1, and a transmission mechanism A3 configured to transmit rotary power to the support members A2 and the like are provided also in the frame A1. A conveying device B is installed below each of the work devices, and these are configured so as to be able to convey the conveying pallet A in the longitudinal direction by way of conveying rollers B3 that are coupled to a motor B1 and a transmission mechanism B2. For the purpose of guiding the conveyance of the conveying pallet A, the conveying device B is provided with guide rollers B4 on one side of the conveying path and, on the other side of the conveying path is provided with a pressing rollers B6, which are connected to air cylinders B5. The two rollers B4 and B6 sandwich the conveying pallet A so as to prevent the position thereof from deviating to the right or left.

As a means for rotating the shaft-shaped workpiece 1, the conveying device B is provided with a motor B7, and a drive-side coupling joint B8 for the magnetic coupling MC is attached at the top of a drive shaft, thereof. Furthermore, a driven-side coupling joint A4 for the magnetic coupling MC is attached to the bottom of the transmission mechanism B2 on the conveying pallet A. Consequently, when the conveying pallet A is conveyed to a predetermined position and stopped, the support members A2 on the conveying pallet A can be rotated by the driving force of the motor B7 on the conveying device B. When the shaft-shaped workpieces 1 are attached on the support members A2, the shaft-shaped workpieces 1 can be rotated together with the support members A2 at each work device, so that the work (preheating, thermal spraying, masking, shot blasting, cleaning) for forming the magnetostrictive region around the entire circumference in a partial region of the shaft-shaped workpieces 1 can be performed smoothly.

Magnetic poles are arranged on the opposing faces of the drive-side coupling joint B8 and the driven-side coupling joint A4 of the magnetic couplings MC on the conveying device B and the conveying pallet A, segmented as shown in FIG. 2C, That is to say, same polarity poles (N poles in the illustrated example) are placed in the centers of both of the coupling joints B8 and A4, and N poles and S poles are arranged alternately around the poles in the centers. By using coupling joints B8 and A4 having such magnetic pole arrangement, because the traction in the thrust direction is reduced, resistance can be minimized when conveying.

Furthermore, the conveying rollers B3 on the conveying device B are narrowed in the middle portion excluding the two ends. When the conveying pallet A is moving, as a result of magnetic forces, unnecessary tractive force acts between the coupling joint A4 and the conveying roller B3 when these approach each other, and therefore the conveying roller B3 is narrowed in the middle portion so as to increase the gap between the coupling joint A4 and the conveying roller B3.

In addition to the conveying devices B described above, traversing devices C1 and C2 are also provided in the manufacturing equipment in FIG. 1, which move the conveying pallet A in a direction perpendicular to the conveying paths of the conveying devices B. With this manufacturing equipment, by arranging such traversing devices C1 and C2 at the ends of a continuous conveying path constituted by a series of conveying devices 13 as shown in the figure, the conveying pallet A can be conveyed between the work devices along a rectangular circulating path.

Figure 3A:
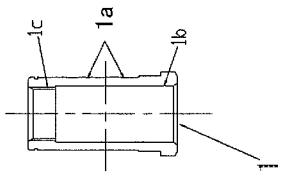
FIGS. 3A to 3E are front views showing a hollow shaft-shaped workpiece 1, a holder 21B for attaching this on a conveying pallet A, and cylindrical covers 3 which cover these.
Figure 3B:
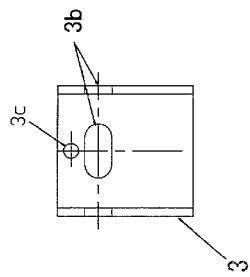
Figure 3D:
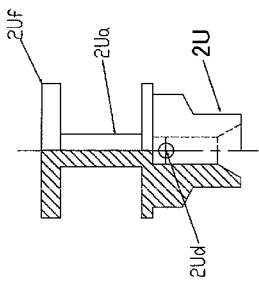
Figure 3E:
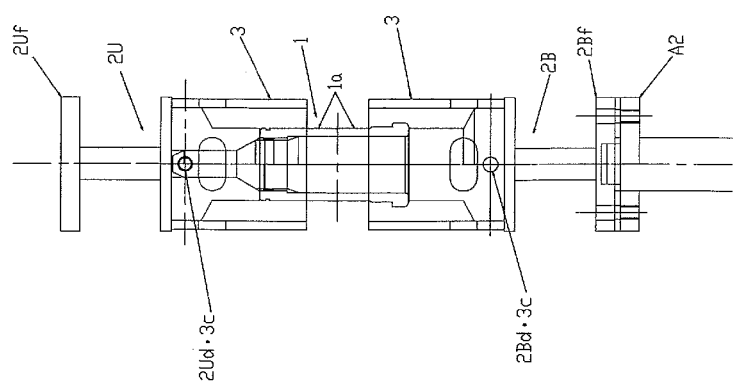
Figure 4A:
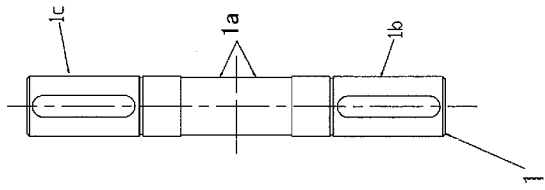
FIGS. 4A to 4D are front views showing a solid shaft-shaped workpiece 1, a holder 2 for attaching this on a conveying pallet A, and cylindrical covers 3 which cover these.

As shown in FIG. 3A and FIG. 4A, the shaft-shaped workpiece 1 has a magnetostrictive region formation part 1a at the longitudinal center. The shaft-shaped workpiece 1 is generally made of carbon steel but a titanium or stainless steel shaft-shaped workpiece 1 is sometimes used. Furthermore, the shaft-shaped workpiece 1 may be hollow as in FIG. 3A or solid as in FIG. 4A. Usually, twelve of such shaft-shaped workpieces 1 are attached to the support members A2 of the conveying pallet A (see FIGS. 2A to 2C) in the manner depicted in FIG. 3E or FIG. 4D.

Figure 4B:
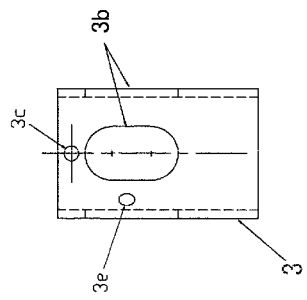
Figure 4C:
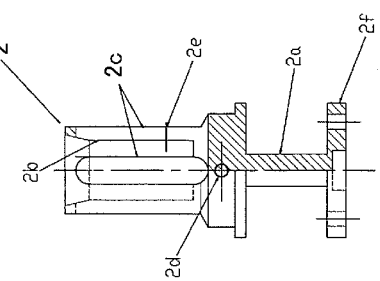

If the shaft-shaped workpiece 1 is solid, the holder 2 shown in FIG. 4C is fixed to the support member A2 with bolts or the like, and the bottom end of the shaft-shaped workpiece 1 is inserted into the holder 2 so as to be supported, The holder 2 has a hollow part 2b at the end of a leg 2a such that the bottom end of the shaft-shaped workpiece 1 can be inserted into the hollow part 2b with a close fit, so as not rotate with respect to the holder 2. Oval openings 2c are formed in four places in the side wall of the holder 2 allowing the hollow part 2b to communicate with the exterior.

A cylindrical cover 3, shown in FIG. 4 B, is further attached to the holder 2 on the support member A2. The cylindrical covers 3 are jigs that cover both ends of the shaft-shaped workpiece 1 so that work such as thermal spraying will be performed only in the magnetostrictive region formation part 1a on the shaft-shaped workpiece 1. The cylindrical cover 3 is fixed to the holder 2 by inserting a fastening screw into a screw hole 2d of the holder 2, via a hole 3c in the cylindrical cover 3, Elliptical openings 3b are likewise formed passing through between the interior and the exterior at four positions in the side wall of the cylindrical cover 3.

In order to prevent rotation of the shaft-shaped workpiece 1 with respect to the holder 2, a screw hole 2e passes through the side of the holder 2 as shown in FIG. 4C, and a through hole 3e is formed in a corresponding region of the cylindrical cover 3 (an outer position overlapping with the screw hole 2e) as shown in FIG. 4B. A fastening screw (not shown) is fitted into the screw hole 2e in the holder 2 via the through hole 3e in the cylindrical cover 3, and the distal end thereof protrudes into the holder 2, whereby the shaft-shaped workpiece 1 rotation is fastened.

Meanwhile, a holder 2 of the same (symmetrical) shape, the same dimensions, and the same material (carbon steel) as the aforementioned holder 2 is likewise attached at the top end of the shaft-shaped workpiece 1, symmetrically with the bottom end, and a cylindrical cover 3 of the same (symmetrical) shape, the same dimensions, and the same material (carbon steel) as the aforementioned cylindrical cover 3 likewise covers that holder 2. It is riot necessary to support the top end of the shaft-shaped workpiece 1 on the conveying pallet A, and therefore a holder 2 is not necessary on the top end for purposes of handling or the like, but by attaching a holder 2 and a cylindrical cover 3 which are the same as on the bottom end, the thermal conditions are made equal to those on the bottom end. That is to say, the heat capacity of the shaft-shaped workpiece 1 including the holder 2 and the cylindrical cover 3 is made the same at the top end and the bottom end, whereby preheating and thermal spraying of the magnetostrictive region formation part 1a can be suitably performed.

Furthermore, the structure that both the upper and lower holders 2 and cylindrical covers 3 have the openings 2c and 3b in the side walls as described above is advantageous in that preheating will be suitably performed on the shaft-shaped workpiece 1. This is because the entirety of the part 1a can be uniformly preheated, by way of heating the outer portion of the magnetostrictive region formation part 1a (each portion above and below the part 1a) through these openings 2c and 3b.

Figure 3C:
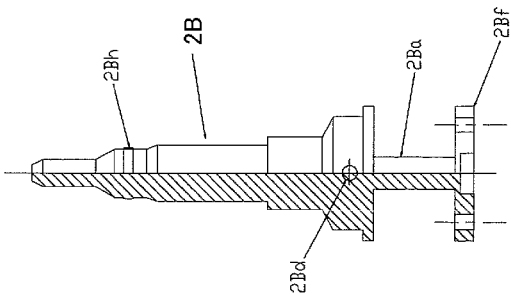

If the shaft-shaped workpiece 1 is hollow, a rod-like lower holder 2B, which is shown in FIG. 3C, is fixed to the support member A2 with bolts or the like, and the entire length of the shaft-shaped workpiece 1 is supported by way of covering this holder 2B. The holder 2 has splines 2Bh in the vicinity of the distal end thereof which bind to splines 1c on the shaft-shaped workpiece 1 and thus function to prevent the workpiece 1 from rotating.

The cylindrical cover 3 shown in FIG. 3B is also attached to the holder 2B on the support member A2, The cylindrical cover 3 is a jig that is used for the same purpose as that in FIG. 4B, and is fixed on the holder 2B by inserting a fastening screw into the screw hole 2Bd of the holder 2 via the hole 3c. Furthermore, openings 3b are likewise formed passing through between the interior and the exterior at four positions in the side wall of the cylindrical cover 3 in FIG. 3B.

For a hollow shaft-shaped workpiece 1, an upper holder 2U having approximately the same shape at the base (symmetrical) and of the same dimensions and material (carbon steel) as the aforementioned lower holder 2B is attached at the top end, bound to the holder 2B as shown in FIG. 3E, and a cylindrical cover 3 of the same (symmetrical) shape, the same dimensions and the same material (carbon steel) as the aforementioned cylindrical cover 3 is also attached to that holder 2U. The overall holder shape, resulting from bounding the holder 2B and the holder 2U, is vertically symmetrical, and the cylindrical covers 3 are likewise arranged vertically symmetrically, whereby the thermal conditions are made equal at the top end and the bottom end, such that the magnetostrictive region formation part 1a can be suitably preheated and thermally sprayed. Furthermore, forming the openings 3b in the side walls of both the upper and lower cylindrical covers 3 allows preheating of the shaft-shaped workpiece 1 to be performed uniformly, in the same manner as in the example in FIGS. 4A to 4D.

Figure 4D:
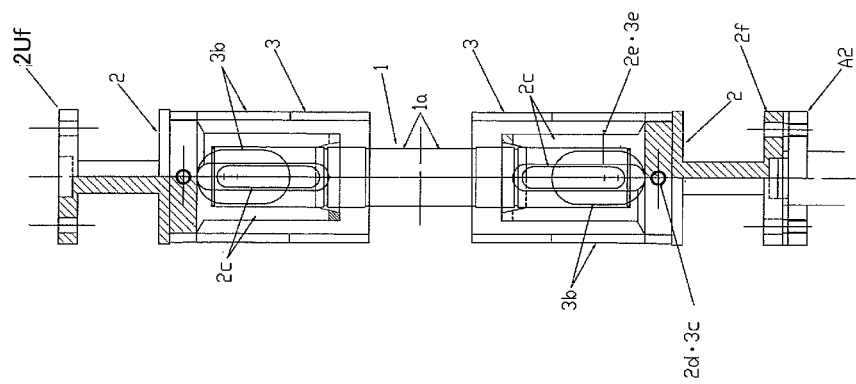
Figure 5:
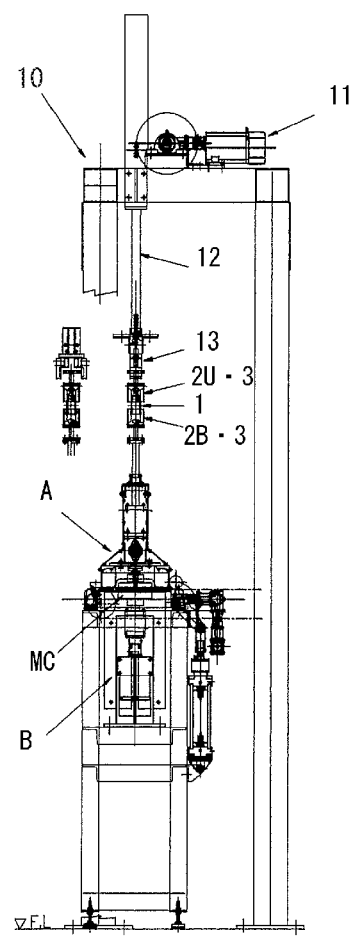
FIG. 5 is a side view showing a device 10 for mounting and dismounting shaft-shaped workpieces 1 on and from a conveying pallet A.

Among the plurality of work devices installed in the manufacturing equipment in FIG. 1, the mounting/dismounting device 10 provided at the end is configured as shown in FIG. 5. The mounting/dismounting device 10 is for attaching and detaching the shaft-shaped workpieces 1 to and from the conveying pallet A and, therein, elevating rods 12 are raised and lowered by an elevating motor 11, the ends of the elevating rods 12 being equipped with chucks 13 for the holders 2, 2U, which are provided at the upper ends as depicted in FIG. 3E and FIG. 4D. Mounting on, and dismounting from, the lower holders 2 can be performed by using the chucks 13 to hold discs 2Uf on the holders 2, to which the cylindrical covers 3 and the shaft-shaped workpieces 1 have been attached, and moving these up and down.

Figure 6:
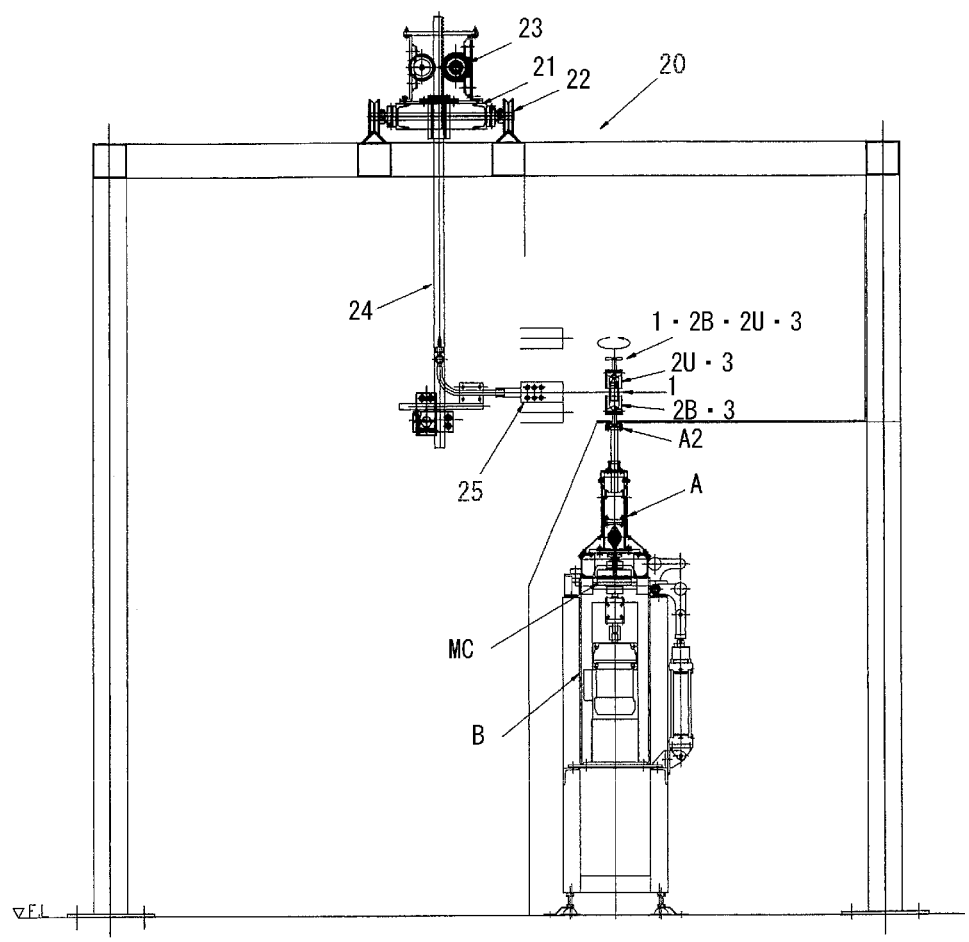
FIG. 6 is a side view showing a preheating device 20.

A preheating device 20, which is disposed adjacent to (downstream from) the mounting/dismounting device 10 has the configuration shown in FIG. 6. That is to say, elevating motors 23 are mounted on a support frame 21, and elevating rods 24 are raised and lowered by these. Gas burners 25 provided at the ends of the elevating rods 24 can preheat the shaft-shaped workpieces 1 on the conveying pallet A. Because the conveying pallet A receives driving force from the conveying device B via the magnetic couplings MC, the shaft-shaped workpieces 1 can be uniformly preheated while being rotated.

The support frame 21 of the preheating device 20 is provided with wheels 22 so as to configure this in the manner of a bogie, whereby the burners 25 can be moved in the forward/backward direction (the direction in which the shaft-shaped workpieces 1 are arrayed). For this purpose, the support frame 21 can be moved by using a motor and a coupling rod (neither are shown) similar to the servomotor 44 and a coupling rod 43 in FIG. 10 (thermal spraying device 40 described hereafter). Thus, it is possible to finely adjust the position of the gas burners 25 with respect to the shaft-shaped workpieces 1, or to move the burners 25 to adjacent shaft-shaped workpieces 1 (if the number of burners 25 is less than the number of shaft-shaped workpieces 1).

Figure 7:
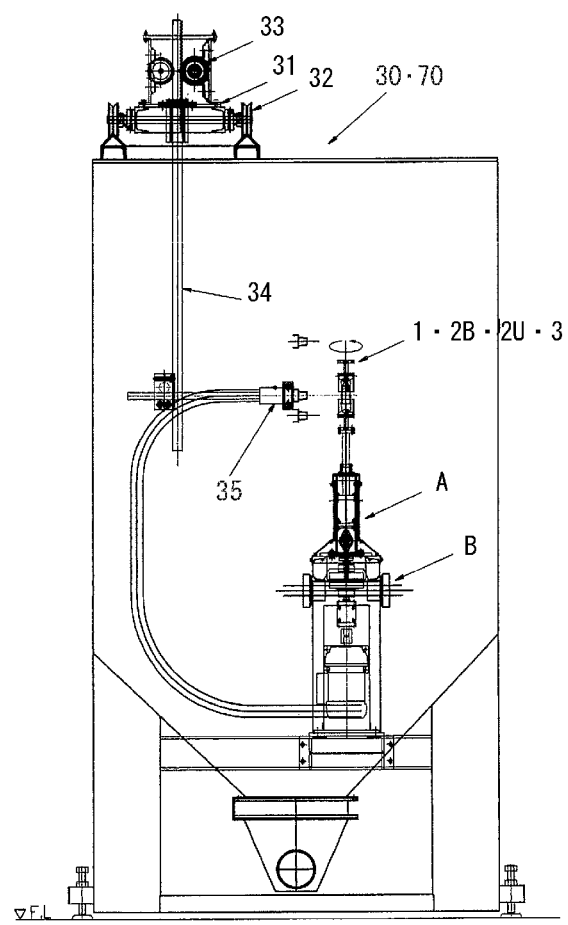
FIG. 7 is a side view showing shot blasting devices 30 and 70.

The shot blasting device 30 and the shot blasting device 70 are work devices configured as shown in FIG. 7. That is to say, elevating motors 33 are mounted on a support frame 31, and elevating rods 34 are raised and lowered by the motors 33. Blast guns 35 are provided at the ends of the elevating rods 34, whereby the magnetostrictive region formation parts 1a on the shaft-shaped workpieces 1 are subjected to shot blasting.

The shot blasting device 30, which is disposed at a position downstream adjacent to the preheating device 20 in FIG. 1, is used for the purpose of forming fine roughness on the magnetostrictive region formation part 1a of the shaft-shaped workpiece 1, prior to thermal spraying. Furthermore, the shot blasting device 70 provided on the downstream side of the masking device 60 performs shot blasting directed to the magnetostrictive region formation part 1a in which the thermally sprayed metallic glass coating has been masked with a striped pattern or the like, in order to remove the portions of the metallic glass coating that are not masked.

As with the preheating device 20 and the thermal spraying device 40 described hereafter, these shot blasting devices 30 and 70 can also move in the direction in which the shaft-shaped workpieces 1 are arrayed, by way of action of wheels 32, motor, a coupling rod and the like.

Figure 8:
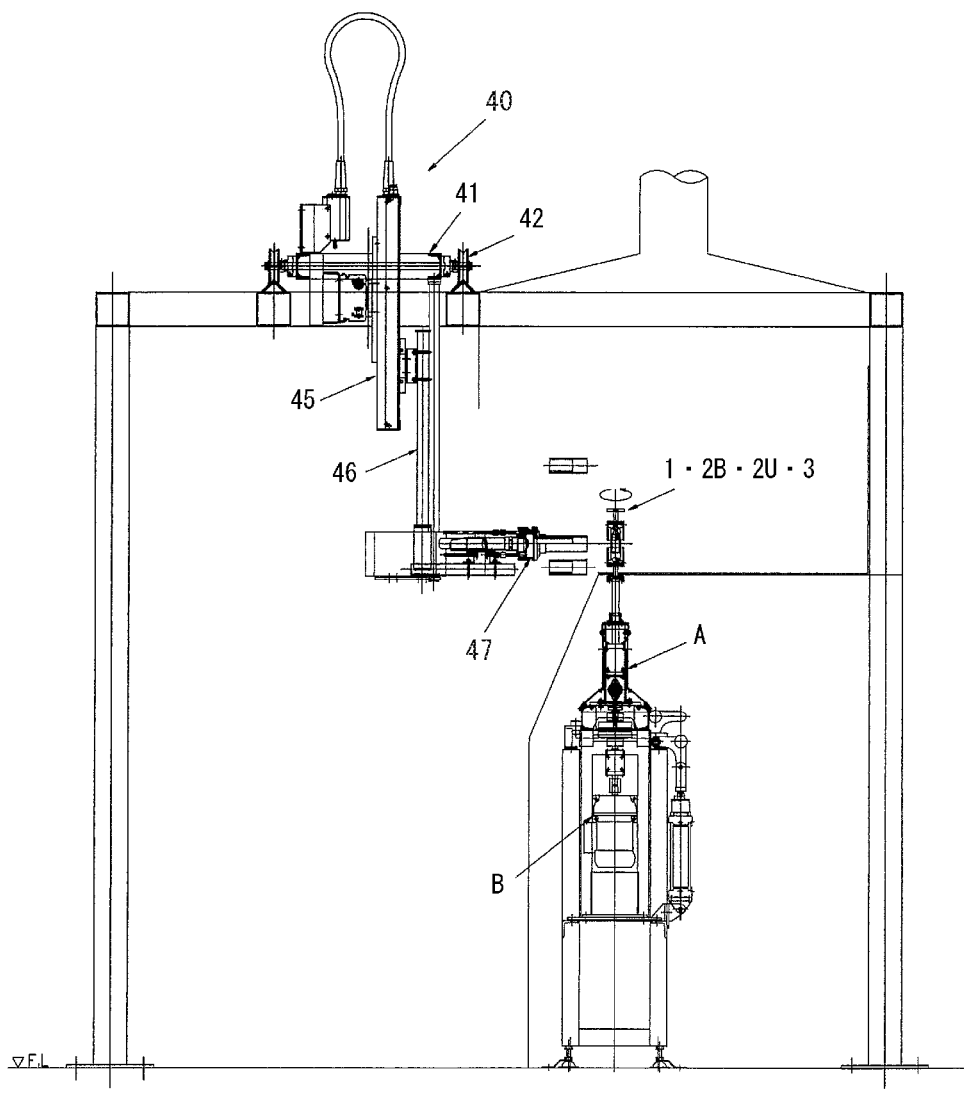
FIG. 8 is a side view showing a thermal spraying device 40.
Figure 9:
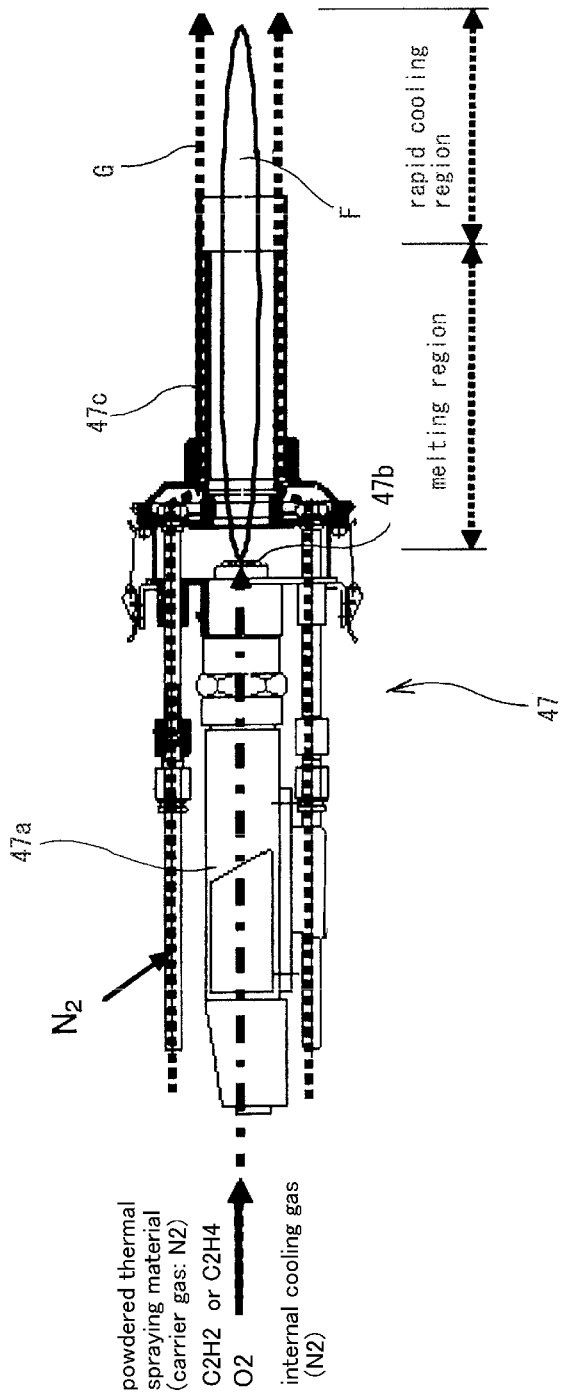
FIG. 9 is a detailed view showing a thermal spray gun 47 included in the thermal spraying device 40.
Figure 10:
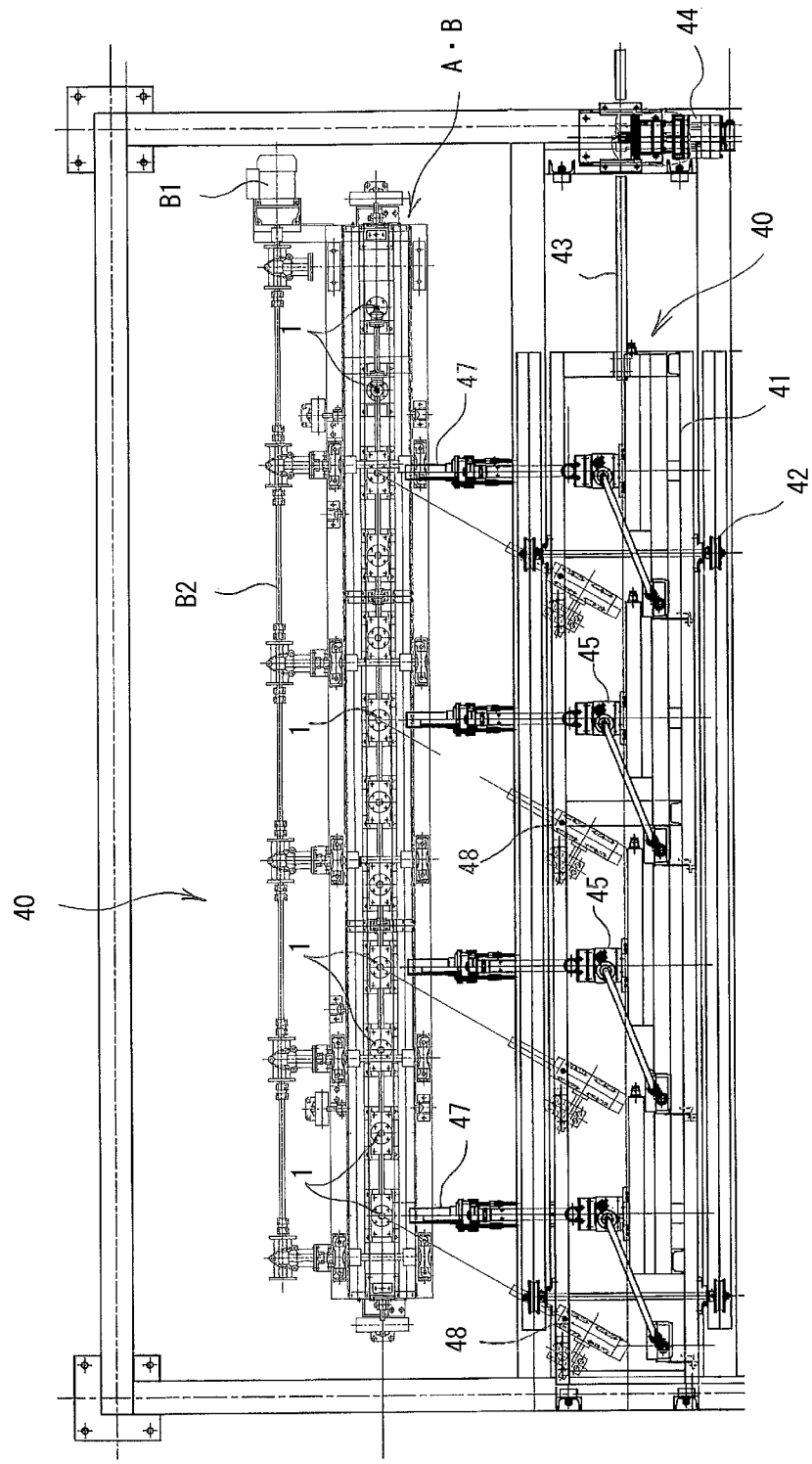
FIG. 10 is a plan view showing a thermal spraying device 40.

The thermal spraying device 40 disposed at a position downstream adjacent to the shot blasting device 30, has the configuration shown in FIG. 8 to FIG. 10. First, as shown in FIG. 8, elevating and traversing actuators 45 are attached to a support frame 41, which raise and lower elevating rods 46 and can traverse in the forward/backward direction (direction in which the shaft-shaped workpieces 1 are arrayed), and thermal spray guns 47 are provided at the ends of the elevating rods 46. During thermal spraying with the thermal spray guns 47, the shaft-shaped workpieces 1 are rotated and the thermal spray guns 47 are raised and lowered and traversed by the actuators 45, whereby thermal spraying coatings are uniformly formed in the magnetostrictive region formation parts 1a of the shaft-shaped workpieces 1 while controlling the temperature of those parts 1a. Since wheels 42 are attached to the support frame 41, the thermal spray guns 47 can be moved by the servomotor 44, the coupling rod 43 and the like shown in. FIG. 10, in the direction in which the shaft-shaped workpieces 1 are arrayed. As shown in FIG. 10, the number (4) of thermal spray guns 47 is less than the number (12) of shaft-shaped workpieces 1, but as described above, since the thermal spray guns 47 can move, thermal spraying can be successively performed on all the shaft-shaped workpieces 1, and the positions of the thermal spray guns 47 can be finely adjusted.

The thermal spray gun 47 is a powder-type flame thermal spray gun having the structure shown in FIG. 9 and can form a metallic glass (amorphous alloy) coating on the surface of the shaft by way of rapidly cooling the flame.

As shown in the figure, in the thermal spray gun 47 a double-pipe cylinder 47c, which is also referred to an external cooling device, and the like are attached to the front of a gun body 47a. The thermal spray gun 47 is connected to a tube that supplies a powdered material to be thermally sprayed together with a transport gas (for example nitrogen) and supply tubes for oxygen and fuel (acetylene or ethylene), as well as a supply tube for an internal cooling gas (for example nitrogen). At the front end of the thermal spray gun 47, there is a nozzle 47b that sprays a flame and the powdered thermal spraying material. The internal cooling gas is discharged from a position adjacent to the periphery of the nozzle 47b so as to cool the nozzle 47b and regulate the temperature of the flame. With the cylinder 47c shown, flame F that is sprayed from the thermal spray gun 47 and the outside air are separated from each other in the first half of the flame F (the portion close to the nozzle 47b, which is the region in which the material powder is melted), and the cooling gas (for example, nitrogen) G is discharged from the forward end of the double-pipe to the latter half of the flame F so as to cool the flame F.

In this thermal spray gun 47, material particles with the same components as the alloy to be used as the coating are sprayed from the nozzle 47b together with the flame F, the material particles are melted by the flame F and then cooled by the cooling gas G, whereby a metallic glass coating can be formed on the surface of the shaft-shaped workpiece 1. The speed of the flame F is set to approximately 30 to 40 m/s, and the temperature of the flame F is caused to be 1000 to 1200° C., in the vicinity of the center of the flame (adjusted depending on the individual material particles). Because the flame F reaches the substrate (shaft-shaped workpiece 1), with being surrounded by the cylinder 47c and the cooling gas G that is ejected from the cylinder 47c, the quantity of oxides present in the metallic glass coating can be limited.

For example, an Fe—Co—Si—B—Nb based (for example, (Fe1-xCox)72B20Si4Nb4) metallic glass coating may be formed on the magnetostrictive region formation part 1a of the shaft-shaped workpiece 1 with the thermal spraying device 40. This type of component system is preferable in that it has high amorphous formation capacity, is easily amorphized, and this has excellent magnetic properties, and in terms of the mechanical properties thereof, is not readily plastically deformed.

As shown in FIG. 10, the thermal spraying device 40 is provided with non-contact type thermometers 48 in positions close to each of the thermal spray guns 47, which measure the temperature of the surface of the shaft-shaped workpieces 1 (magnetostrictive region formation parts 1a) that are thermally sprayed. Depending on the measured value of the temperature, the temperature of the shaft-shaped workpieces 1 (magnetostrictive region formation part 1a) during thermal spraying are kept constant by shifting the position of the thermal spray guns 47 vertically and laterally with the actuators 45, for example, so that the properties of the coating and the degree of adhesion with the shaft-shaped workpieces 1 are improved.

The shaft-shaped workpieces 1 on which the metallic glass coating has been formed by thermal spraying are conveyed from the thermal spraying device 40 depicted in FIG. 1 to the adjacent cooling device 51, and after having been air-cooled there for a predetermined time, are transversely conveyed together with the conveying pallet A, by the traversing device C1, toward a loading-side table 52 on the opposite side, and further conveyed to the masking device 60. The masking device 60 is a device for forming, on the metallic glass coating on the shaft-shaped workpiece 1a, a rubber-like coating which has the same pattern as the helical striped pattern for the magnetostrictive region. After forming such a rubber-like coating as a covering, shot blasting is performed on the metallic glass coating by the subsequent shot blasting device 70, thereby removing the metallic glass coating in the uncovered portions, so as to produce a magnetostrictive region with a striped pattern made from the metallic glass coating.

Figure 11:
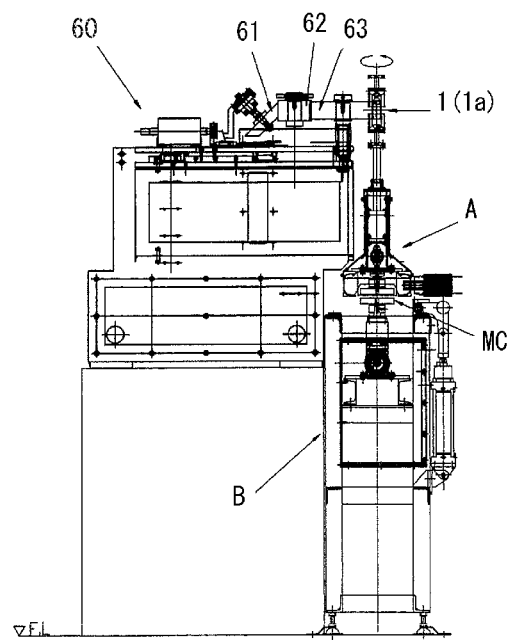
FIG. 11 is a side view showing a masking device 60.

The configuration of the masking device 60 is as shown in FIG. 11. As shown in the figure, three transfer rollers (an ink fountain roller 61, a gravure plate roller 62 and a transfer roller 63) are provided for the purpose of applying/forming the covering in the magnetostrictive region formation part 1a of the shaft-shaped workpiece 1. The rubber (or other resin) used for the covering is first provided to the circumferential face of the ink fountain roller 61, and the rubber is transferred to the gravure plate roller 62 which has been engraved with recesses in the circumferential surface that correspond to the striped pattern that will be used for the magnetostrictive region. Of the rubber that has been applied to the circumferential face of this roller 62, only that which remains in the recesses after scraped off with a scraper (not shown) is transferred to the magnetostrictive region formation part 1a of the shaft-shaped workpiece 1 by way of the circumferential face of the transfer roller 63.

As shown in FIG. 1, the shot blasting device 70 is disposed on the downstream side of the masking device 60, with the cooling device 53 interposed therebetween. The configuration of the shot blasting device 70 is the same as that of the shot blasting device 30, as shown in FIG. 7. In this device 70, shot blasting is performed directed to the magnetostrictive region formation part 1a of the shaft-shaped workpiece 1 on which the covering has been formed by the masking device 60, and the metallic glass coating in those portions without the covering is removed. Since the shot blasting does not have an effect on those parts that are covered with rubber, the metallic glass coating remains in the aforementioned striped pattern.

Figure 12:
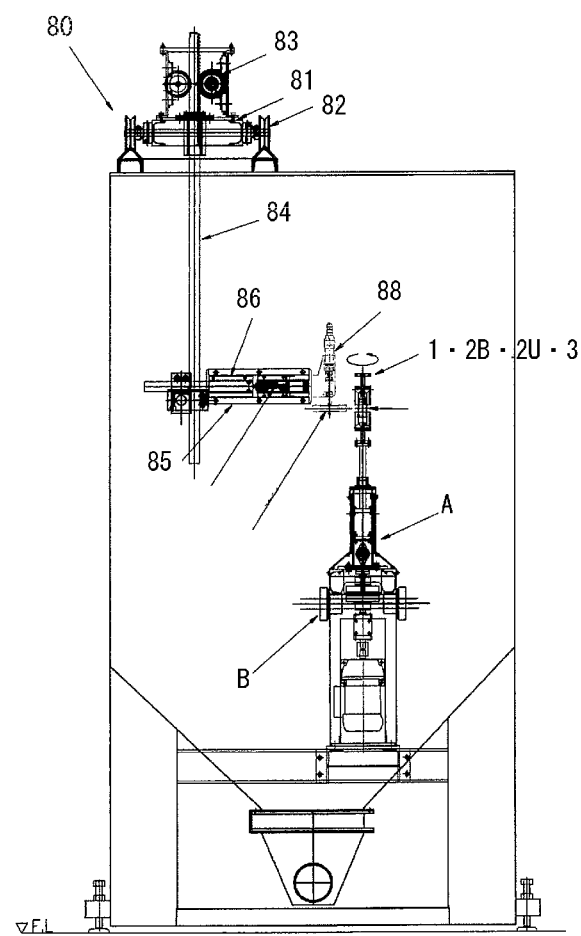
FIG. 12 is a side view showing a cleaning device 80.

Further downstream of the masking device 60 and the shot blasting device 70, a cleaning device 80, as depicted in FIG. 12, is disposed. The cleaning device 80 is a device for removing the rubber of the covering from the magnetostrictive region formation part 1a after shot blasting and cleaning the surface of this part 1a.

As shown in FIG. 12, the cleaning device 80 has a structure in which elevating motors 83 are mounted on a support frame 81 and elevating rods 84 are raised and lowered by the motors 83. Wire brush rollers 89 for pressing against the magnetostrictive region formation parts 1a of the shaft-shaped workpieces and the like are attached at the ends of the elevating rods 84. The wire brush rollers 89 are mounted on the output shaft of air motors 88 and are thus rotationally driven. Frames 85 configured to support the air motors 88 are attached, via a pressure setting spring 87, to the working ends of air cylinders 86 that is used for pushing. Consequently, the wire brush rollers 89 are pressed against the shaft-shaped workpieces 1 by the air cylinders 86, with the pressing pressure being determined by the spring coefficient of the springs 87. The rubber covering on the metallic glass coating of the shaft-shaped workpiece 1 is not readily eliminated by shot blasting, but it is relatively easily removed when abraded by the wire brush roller 89.

Note that this cleaning device 80 can also move the wire brush rollers 89 and the like in the direction in which the shaft-shaped workpieces 1 are arrayed, by way of operating wheels 82, a motor, a coupling rod and the like similar to the motor 44 and the coupling rod 43 in the thermal spraying device 40 depicted in FIG. 10.

In the manufacturing equipment depicted in FIG. 1, an unloading-side table 54 is provided downstream of the cleaning device 80, and the traversing device C2 is disposed extending from the unloading-side table 54 to the mounting/dismounting device 10. Consequently, a plurality of shaft-shaped workpieces (torque sensor shafts) 1 on which cleaning has been performed so as to finish formation of the magnetostrictive region can be returned, together with the conveying pallet A, to the mounting/dismounting device 10 and collected there.

In the circulating path starting from the mounting/dismounting device 10 and returning to the same mounting/dismounting device 10, one conveying pallet A, or a small number of conveying pallets A, may be successively advanced to each work device. However, when approximately eight conveying pallets A with twelve shaft-shaped workpieces 1 are present on the circulating path at the same time, such that a conveying pallet A is constantly undergoing some processing at each of the work devices, the torque sensor shaft production speed can be maximized.

Figure 13:
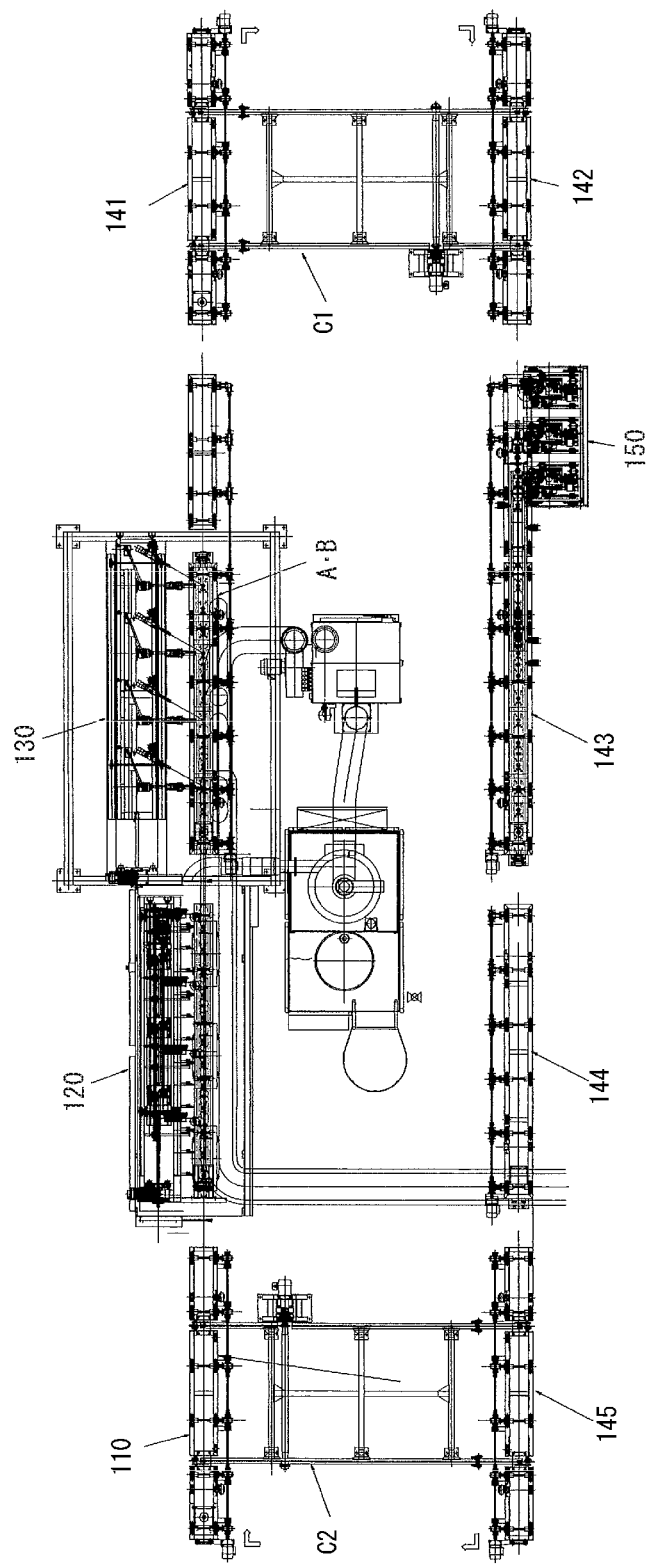
FIG. 13 is a plan view showing the overall arrangement of shaft manufacturing equipment according to another embodiment.
Figure 14:
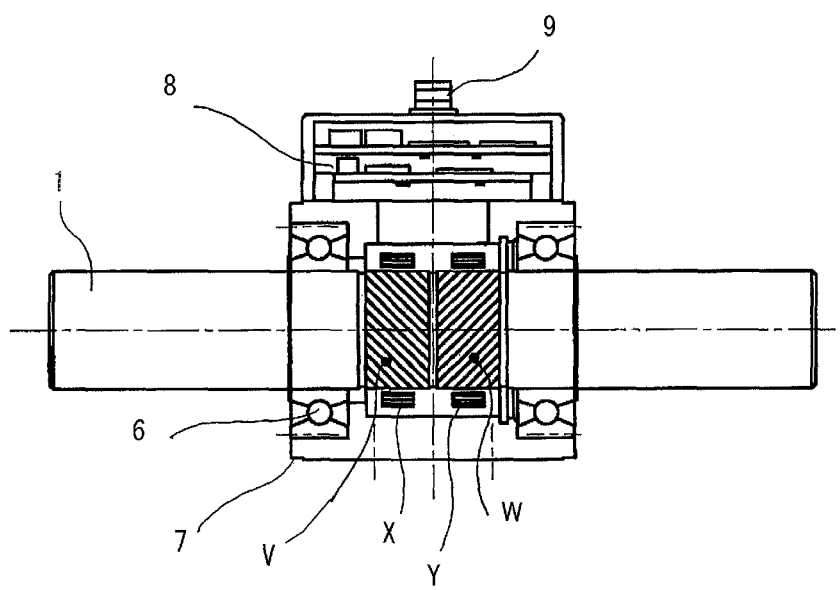
FIG. 14 is a longitudinal sectional view showing the general structure of a torque sensor, Description of Embodiments

FIG. 13 shows a mode for the manufacturing equipment that differs from that described above. This equipment manufactures a torque sensor shaft similar to that described above, but is configured to be more compact than that shown in FIG. 1 and, with a lower production capacity, equipment costs are reduced.

As with the equipment in FIG. 1, this equipment in FIG. 13 is also such that a plurality of shaft-shaped workpieces serving as torque sensor shafts are attached to a conveying pallet A, and the resulting conveying pallet A is conveyed to each of the work devices by conveying devices B. The conveying devices B are provided for each work device and transmit rotational driving force to the conveying pallet A via a magnetic coupling (not shown), whereby the shaft-shaped workpieces 1 on the conveying pallet A are subjected to processing such as thermal spraying by each of the work devices while being rotated. Furthermore, traversing devices C1 and C2 are provided in addition to the conveying devices B, and the conveying pallet A is moved along a circuital trajectory by these. In this regard, the manufacturing equipment in FIG. 13 is the same as the equipment in FIG. 1.

In the manufacturing equipment in FIG. 13, there are fewer work devices, which are arranged as follows. Specifically, a shot blasting device 120, a thermal spraying device 130, cooling devices 141 and 142, a masking device 150, and cooling devices 143, 144, and 145 are arranged in this order on the clockwise path shown in the figure, starting from the mounting/dismounting device 110. Furthermore, after causing the conveying pallet A to make one circuit around the clockwise path, starting from the mounting/dismounting device 110, and then once again sending it from the mounting/dismounting device 110 to the shot blasting device 120, and subsequently returning it to the mounting/dismounting device 110, the shaft-shaped workpieces 1 are collected there.

The mounting/dismounting device 110 is for manually mounting the shaft-shaped workpieces on, or dismounting the shaft-shaped workpieces from, the conveying pallet A.

The shot blasting device 120 is a device with which three types of work are jointly performed by a single device, by performing shot blasting on the shaft-shaped workpiece 1 to produce roughness prior to thermal spraying, and after the thermal spraying and masking by the thermal spraying device 130 and the masking device 150 are completed (which is to say, after one circuit of the circulating path), once again performing shot blasting to form the magnetostrictive region, as well as performing cleaning to remove the rubber of the covering. For this purpose, both the blast guns and the brush rollers are provided in a manner allowing for raising and lowering and the like, based on the configurations shown previously in FIG. 7 and FIG. 12.

In addition to thermal spraying on the shaft-shaped workpiece, the thermal spraying device 130 is also caused to perform advance preheating. The thermal spraying is carried out in the same manner as in the thermal spraying device 40 described above (FIGS. 8 to 10), but preheating is carried out by outputting only the flame F from the thermal spray gun 47 in FIG. 9 (not spraying the material powder).

The masking device 150 uses the masking device 60 (FIG. 11) described above without modification.

The cooling devices 141 to 145 likewise air-cool the shaft-shaped workpieces using the same items as described above in the same manner as described above.

Although the manufacturing equipment depicted in FIG. 13 which is configured and used as described above has a lower capacity for mass production of the torque sensor shafts than that depicted in FIG. 1, it is advantageous in terms of equipment cost, and in that the equipment length is short and the area occupied is low. If it is necessary to increase the production capacity, a dedicated shot blasting device 120 and thermal spraying device 130 may be used, and the other work devices that are necessary in conjunction therewith can be placed in the locations of any of the cooling devices 141 to 145 and the like in FIG. 13.

The invention claimed is:

1. Equipment for manufacturing a torque sensor shaft by forming a magnetostrictive region including a metallic glass coating in a predetermined pattern on a side face of a hollow or solid shaft-shaped workpiece, wherein
the magnetostrictive region has a formation part, which is disposed between opposing first and second ends of the shaft-shaped workpiece,
the shaft-shaped workpiece is rotatably attached on a conveying pallet,
the conveying pallet is successively conveyed to each of work devices including a preheating device for the shaft-shaped workpiece, a thermal spraying device configured to form a metallic glass coating on the side face of the shaft-shaped workpiece, a masking device configured to provide a covering corresponding to the pattern on the coating, and a shot blasting device configured to provide shot blasting directed toward the metallic glass coating including the covering,
preheating, thermal spraying, masking, and shot blasting are performed on the shaft-shaped workpiece while rotating the shaft-shaped workpiece on the conveying pallet at each of the work devices, and
when on the conveying pallet, the first and second ends of the shaft-shaped workpiece are covered by first and second cylindrical covers respectively, and
the shaft-shaped workpiece is of such length that the formation part of the shaft-shaped workpiece is exposed between opposing end faces of the first and second cylindrical covers.

2. The equipment for manufacturing the torque sensor shaft according to claim 1, wherein
the shaft-shaped workpiece is hollow, and
each of the first and second cylindrical covers has a respective opening configured to expose part of the shaft-shaped workpiece.

3. The equipment for manufacturing the torque sensor shaft according to claim 1, wherein
the shaft-shaped workpiece is solid,
the first end of the shaft-shaped workpiece when on the conveying pallet is inserted inside a first sleeve-like holder on the conveying pallet so as to be rotatably supported, and is covered by the first cylindrical cover while, at the second end of the shaft-shaped workpiece, a second sleeve-like holder shaped symmetrical to the aforementioned first sleeve-like holder is also attached and the shaft-shaped workpiece is covered by the second cylindrical cover, and
each of the first and second sleeve-like holders and each of the first and second cylindrical covers has a respective opening configured to expose part of the shaft-shaped workpiece.

4. The equipment for manufacturing the torque sensor shaft according to claim 1, wherein
each of the work devices is provided with a conveying device configured to convey the conveying pallet along a respective fixed path and stop the conveying pallet at a respective fixed position,
the conveying device is provided with a motor for rotating the shaft-shaped workpiece on the conveying pallet, which has been stopped at a respective one of the fixed positions, and a drive-side magnetic coupling for transmitting the driving force of the motor to the conveying pallet, and
the conveying pallet is provided with a driven-side magnetic coupling that receives the driving force in a contactless manner from the drive-side magnetic coupling when the conveying pallet has been stopped at the respective one of the fixed positions, and a transmission mechanism for transmitting the driving force to the shaft-shaped workpiece.

5. The equipment for manufacturing the torque sensor shaft according to claim 4, wherein
a traversing device configured to cause the conveying pallet to traverse in a direction perpendicular to the respective fixed path of the conveying device is provided in addition to the conveying device, and the conveying pallet is conveyed along a circulating path by both types of devices, whereby the conveying pallet is successively conveyed between each of the work devices.

6. The equipment for manufacturing the torque sensor shaft according to claim 1, wherein
a plurality of shaft-shaped workpieces are attached on the conveying pallet, and
a number of one or more of burners in the preheating device, thermal spray guns in the thermal spraying device, covering material application rollers in the masking device, or blast guns in the shot blasting device is less than a number of the plurality of shaft-shaped workpieces provided on the conveying pallet, and the one or more thereof can be moved in a direction in which the plurality of shaft-shaped workpieces are arrayed on the conveying pallet.

7. The equipment for manufacturing the torque sensor shaft according to claim 1, wherein
one or more of a burner in the preheating device, a thermal spray gun in the thermal spraying device, a covering material application roller in the masking device, or a blast gun in the shot blasting device are supported by a support frame at a position higher than the shaft-shaped workpiece on the conveying pallet.

8. The equipment for manufacturing the torque sensor shaft according to according to claim 1, wherein
the thermal spraying device performs thermal spraying of a type in which a flame including a metal powder is sprayed from a thermal spray gun, melting the metal powder, and the flame is cooled by cooling gas from the outside before reaching the side face of the shaft-shaped workpiece, and
the temperature of the side face of the shaft-shaped workpiece that is subjected to thermal spraying is measured by a non-contact type thermometer, and the temperature of the shaft-shaped workpiece during thermal spraying is kept constant by shifting the position of the thermal spray gun depending on the measured value of the temperature.

9. The equipment for manufacturing the torque sensor shaft according to claim 1, wherein a cleaning device configured to remove the covering after performing shot blasting is provided, the cleaning device having a structure in which a wire brush roller is pressed against the side face of the shaft-shaped workpiece by a fluid pressure cylinder, and including a spring for setting the pressing pressure, between a working part of the fluid pressure cylinder and the wire brush roller.

10. A method for manufacturing a torque sensor shaft by forming a magnetostrictive region including a metallic glass coating in a predetermined pattern on a side face of a shaft-shaped workpiece, wherein the manufacturing equipment according to claim 1 is used to perform the preheating, the thermal spraying, the masking, and the shot blasting on the shaft-shaped workpiece while rotating the shaft-shaped workpiece on the conveying pallet at each of the work devices.

\* \* \* \* \*